(12) United States Patent
Di Stefano et al.

(10) Patent No.: US 8,004,296 B2
(45) Date of Patent: Aug. 23, 2011

(54) PROBE HEAD APPARATUS FOR TESTING SEMICONDUCTORS

(75) Inventors: Peter T. Di Stefano, San Jose, CA (US); Konstantine N. Karavakis, Pleasanton, CA (US); Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 45 days.

(21) Appl. No.: 12/209,190

(22) Filed: Sep. 11, 2008

(65) Prior Publication Data
US 2010/0045322 A1  Feb. 25, 2010

Related U.S. Application Data

(60) Provisional application No. 61/189,493, filed on Aug. 19, 2008.

(51) Int. Cl.
*G01R 31/00* (2006.01)

(52) U.S. Cl. ......... 324/750.19; 324/754.03; 324/756.03; 324/762.05

(58) Field of Classification Search ........... 324/754–765
See application file for complete search history.

(56) References Cited

U.S. PATENT DOCUMENTS

| | | | |
|---|---|---|---|
| 4,157,066 A | 6/1979 | Pretty | |
| 4,240,778 A | 12/1980 | Korytko | |
| 4,585,991 A | 4/1986 | Reid et al. | |
| 4,751,457 A | 6/1988 | Veenendaal | |
| 4,968,931 A | 11/1990 | Littlebury et al. | |
| 5,336,992 A | 8/1994 | Saito et al. | |
| 5,555,422 A | 9/1996 | Nakano | |
| 5,735,201 A * | 4/1998 | Hirao et al. | 100/269.01 |
| 6,064,217 A | 5/2000 | Smith | |
| 6,320,372 B1 | 11/2001 | Keller | |
| 6,674,627 B1 * | 1/2004 | Kund | 361/143 |
| 6,784,678 B2 * | 8/2004 | Pietzschmann | 324/758 |
| 6,828,810 B2 | 12/2004 | Kanamaru et al. | |
| 6,911,835 B2 | 6/2005 | Chraft et al. | |
| 6,977,514 B2 | 12/2005 | Kohno et al. | |
| 7,064,566 B2 | 6/2006 | Khandros et al. | |
| 7,071,012 B2 | 7/2006 | Tan et al. | |
| 7,230,438 B2 | 6/2007 | Crippen | |
| 7,382,143 B2 | 6/2008 | Di Stefano | |
| 7,692,433 B2 * | 4/2010 | Eldridge et al. | 324/754.07 |
| 2006/0255814 A1 * | 11/2006 | Eldridge et al. | 324/754 |
| 2006/0290367 A1 * | 12/2006 | Hobbs et al. | 324/763 |
| 2008/0036480 A1 * | 2/2008 | Hobbs et al. | 324/754 |
| 2008/0100312 A1 * | 5/2008 | Breinlinger | 324/754 |
| 2008/0196474 A1 | 8/2008 | Di Stefano et al. | |

* cited by examiner

*Primary Examiner* — Huy Phan
*Assistant Examiner* — Arleen M Vazquez
(74) *Attorney, Agent, or Firm* — Michael B. Einschlag

(57) ABSTRACT

One embodiment is a probe head for contacting microelectronic devices substantially lying in a test plane, the probe head including: (a) one or more substrate tiles having one or more probe tips disposed on a top surface thereof; and (b) a registration-alignment apparatus that holds the one or more substrate tiles: (i) in position so that the one or more probe tips are held in the test plane, and (ii) aligned so that the one or more probe tips are substantially coplanar to the test plane, which registration-alignment apparatus includes: (i) one or more capture elements affixed, directly or indirectly, to a frame; (ii) three or more posts mechanically supporting each of the one or more substrate tiles; and (iii) alignment actuators affixed, directly or indirectly, to the frame and the posts, which alignment actuators may be actuated to enable the posts to move in response to forces applied thereto from the one or more substrate tiles, and may be actuated to prevent the posts from moving.

4 Claims, 7 Drawing Sheets

PROBE HEAD APPARATUS FOR TESTING SEMICONDUCTORS

This patent application relates to U.S. Provisional Application No. 61/189,493 filed Aug. 19, 2008 from which priority is claimed under 35 USC §119(e), and which provisional application is incorporated herein in its entirety.

CROSS-REFERENCE TO RELATED APPLICATIONS

This case is related to a U.S. patent application having application Ser. No. 11/708,517, filed Feb. 20, 2007 which application is assigned to the assignee of this case.

TECHNICAL FIELD OF THE INVENTION

One or more embodiments of the present invention relate to a probe head apparatus for testing semiconductor chips, for example and without limitation, on an uncut wafer or in an array of separate integrated circuit (IC) chips.

BACKGROUND

Semiconductor manufacturers produce semiconductor wafers having hundreds or even thousands of integrated circuits (ICs, also known as chips or semiconductor devices) per wafer. As device geometries decrease and the size of semiconductor wafers increases, the time needed to test all the ICs on semiconductor wafers has increased. This issue is important for testing memory chips where the time to test a chip increases with increases in chip capacity. As a result, memory manufacturers have been driven to test an ever larger number of chips in parallel. Consequently, wafer level testing has become a widely accepted method for testing memory ICs on 200 mm diameter wafers, and is progressing rapidly to full wafer testing for 300 mm diameter wafers. However, industry movement toward full wafer testing has been hindered by difficulty in making good and reliable electrical contact with all chips on a wafer simultaneously. Further, such difficulty is exacerbated at high temperatures by thermal expansion and warpage of the wafer.

In wafer level testing, a number of test probes are placed in contact with selected regions of a wafer under test and, for each die, probe tips are contacted to each bonding pad thereon. Then, using computer controlled test equipment, voltages are generated and conducted to the probe tips, thereby testing a certain number of ICs on the wafer. Typically, wafer level testing involves testing each die to determine whether it passes basic electrical tests such as a test for electrical opens or electrical shorts. In some applications, a functional test is also performed to ensure that the ICs perform as designed.

As the number of elements of an IC to be tested increases (along with an increase in the number of ICs on a wafer), the total number of probe tips contacting a wafer produces a large increase in net force loading of probe tips against the wafer. As a result, under load, a probe substrate warps so much that in some high density applications, deflection of the probe substrate due to warping approaches the displacement range of the probe tips themselves. As a consequence, probe tips do not make uniform or reliable contact with ICs on a wafer under test.

Various approaches to reduce warping under load have been tried with limited success. In one approach, a probe substrate is divided into an array of probe substrate tiles. Each substrate tile may be supported on a number of posts to distribute the load more evenly across the wafer surface and to alleviate warping of the probe substrate tile. A further refinement uses active feedback systems to adjust the heights of the posts to reduce warping effects. While dividing the probe substrate into smaller substrate tiles helps to reduce warping, the tiled probe head introduces a new set of problems including leveling of each probe substrate tile to form a coplanar surface of probe tips, and accurately registering each probe substrate tile with respect to adjacent probe substrate tiles.

Testing high reliability semiconductor devices is often done at several different temperatures to find defects that may cause failure in operation under extreme thermal conditions. For example, DRAM memory devices are tested at temperatures as high as 125° C., and more recently, at even higher temperatures. At such high temperatures, probe substrates and support structures distort and warp, making it difficult to maintain planarity of test probes and to maintain registration of each probe in an X and a Y direction within a plane of the probes. Various approaches to alleviate warping and misregistration due to testing at high temperature have been proposed. In several approaches, a probe substrate is divided into an array of probe substrate tiles. Each substrate tile may be supported on flexible posts, actuators, invar matrices, and so forth. Notwithstanding these efforts, probe heads for full wafer testing at high temperatures are not satisfactory. Wafer probe heads often need to be re-leveled at high temperature to compensate for thermal distortion caused by raising the temperature of the probe head and the wafer under test.

As the number of contact probes on a probe head increases, the head is more difficult to manufacture, repair and align because of yield loss and complexity. Dividing the probe head into an array of probe substrate tiles alleviates problems with fabrication yield and assembly at the expense of additional alignment requirements. In a probe head made up of an array of probe substrate tiles, each probe substrate tile must be registered and leveled with respect to adjacent substrate tiles. Time and expense of registering and leveling the probe head increases with the number of probe substrate tiles making up the probe head.

SUMMARY

One or more embodiments of the present invention provide a probe head apparatus for testing semiconductor chips. In particular, one embodiment is a probe head for contacting an array of microelectronic devices substantially lying in a test plane, the probe head comprising: (a) one or more substrate tiles having one or more probe tips disposed on a top surface thereof; and (b) a registration-alignment apparatus that holds the one or more substrate tiles: (i) in position so that the one or more probe tips are held in the test plane, and (ii) aligned so that the one or more probe tips are substantially coplanar to the test plane, which registration-alignment apparatus comprises: (i) one or more capture elements affixed, directly or indirectly, to a frame; (ii) three or more posts mechanically supporting each of the one or more substrate tiles; and (iii) alignment actuators affixed directly or indirectly to the frame and the posts, which alignment actuators may be actuated to enable the posts to move in response to forces applied thereto from the one or more substrate tiles, and may be actuated to prevent the posts from moving.

DETAILED DESCRIPTION

Figure 1A:
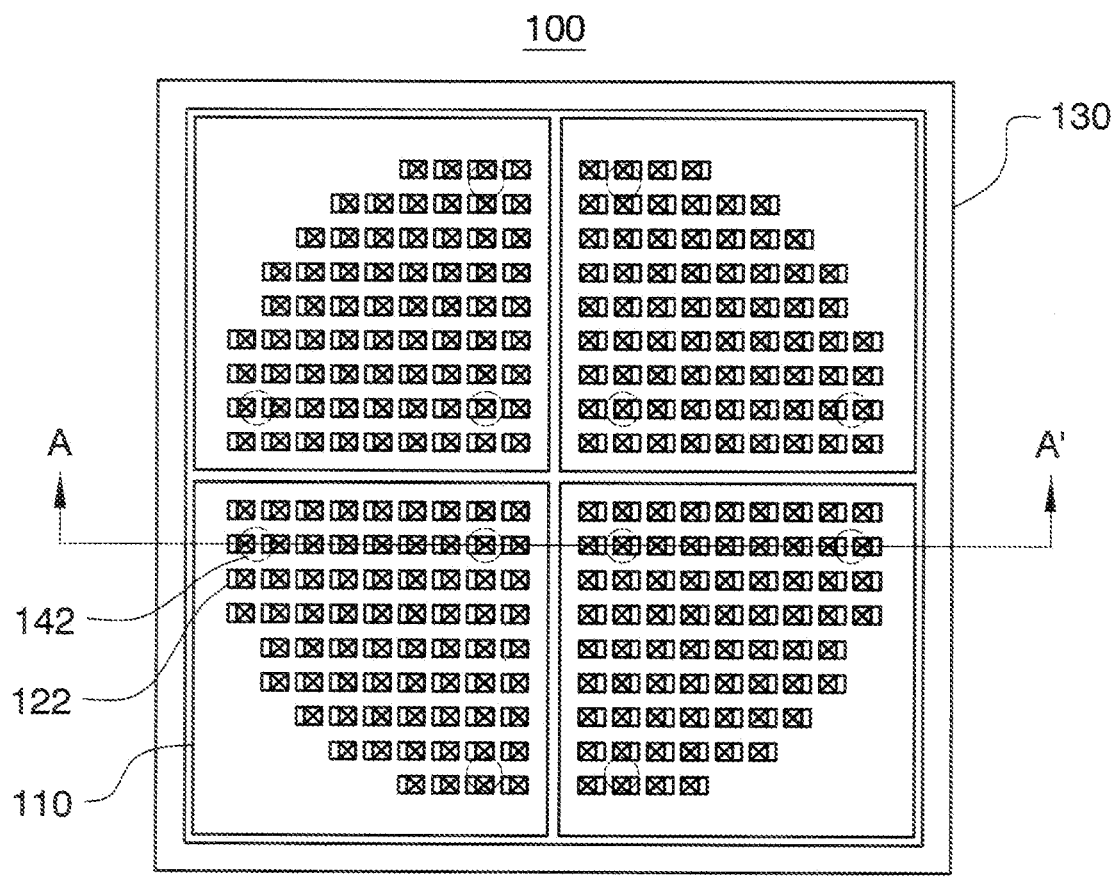
FIG. 1A is a top view of a probe head that is fabricated in accordance with one or more embodiments of the present invention.
Figure 1B:
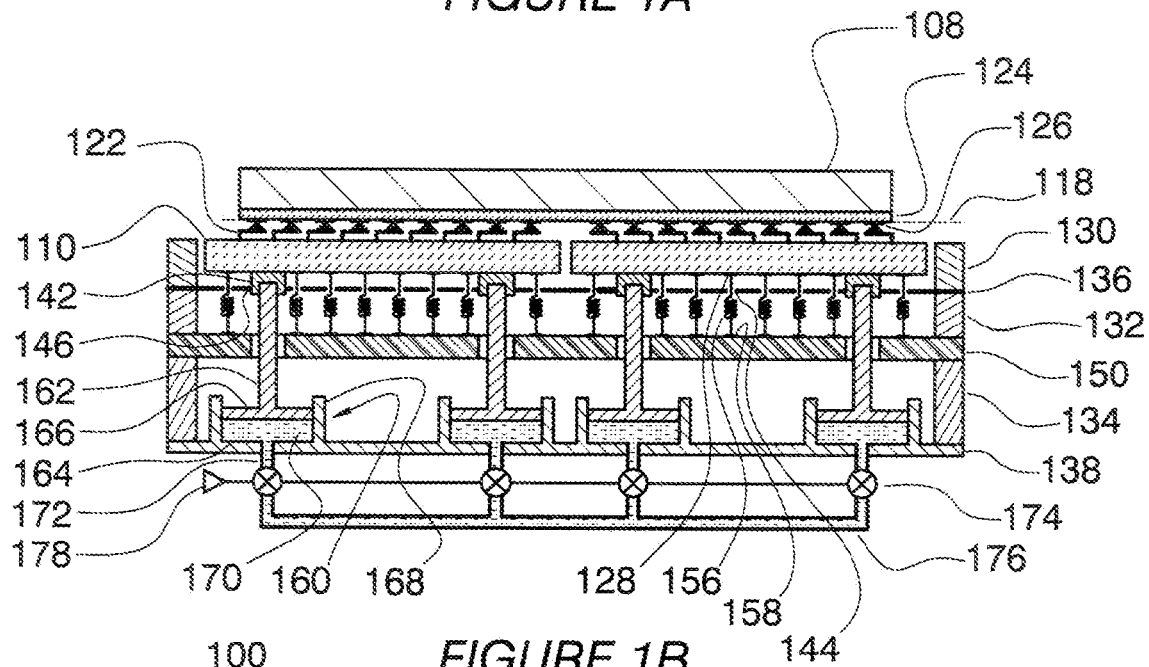
FIG. 1B is a cross-sectional view of the probe head shown in FIG. 1A in contact with a wafer under test, the cross-section being taken along a line between, and in a direction of, arrows A and A' of FIG. 1A.

FIG. 1A is a top view of probe head 100 that is fabricated in accordance with one or more embodiments of the present invention, and FIG. 1B is a cross-sectional view of probe head 100 in contact with device under test (DUT) wafer 124, the cross-section being taken along a line between, and in a direction of, arrows A and A' of FIG. 1A. Note that a DUT wafer is also referred to herein as a wafer under test and is a wafer being tested. By way of simplifying the following description, the direction "up" means a vertical direction toward the top of a page in a cross-sectional view, and "top" means a face shown in a top view. Correspondingly, "down" means a vertical direction toward the bottom of a page in a cross-sectional view, and "bottom" means a face opposing the top face. The term "underlies" means lying on a lower plane toward the bottom of a page, and the term "supporting" means that a supported element is connected to a supporting element, either directly or through intermediate elements. In describing embodiments, the term "wafer probe interconnect apparatus" is also referred to as a "probe head." Lastly, to simplify exposition, labels on identical elements may be omitted, and singular and plural references may be made to one element or many identical elements.

As shown in FIG. 1A, probe head 100 is divided into substrate tiles 110, wherein probe tips 122 (a large number of designs for probe tips suitable for use on substrates such as dielectric substrates are known and available in the art, for example, cantilever probes, spring wire probes, torsion bar probes, buckling beam probes, lithographically formed springs, and the like) are disposed over the top surface of each of substrate tiles 110, where a substrate tile is an individual substrate in an array of substrate tiles that holds probe tips. In accordance with one or more such embodiments of the present invention, a substrate tile is a dielectric, for example, a ceramic material, and in accordance with one or more further such embodiments, a dielectric substrate tile may be fabricated from a printed circuit board. In accordance with one or more such embodiments, probe tips 122 may be aligned to lie substantially coplanar to test plane 118 (referring to FIG. 1B) that substantially coincides with a bottom surface of device under test (DUT) wafer 124. It should be understood that DUT wafer 124 may warp, for example, in high temperature testing, and as a result, the bottom surface of DUT wafer 124 and test plane 118 may only substantially coincide, i.e., to a degree determined by warping.

In accordance with one or more embodiments of the present invention, substrate tiles 110 are held in X and Y position, for example and without limitation, with respect to adjacent ones of substrate tiles 110 so that probe tips 122 are held in X and Y registration in test plane 118, and substrate tiles 110 are aligned so that probe tips 122 thereon are substantially coplanar to test plane 118 (i.e., to a portion of test plane 118 to which they are adjacent) by a registration-alignment apparatus comprised of registration and alignment mechanisms. As shown in FIG. 1B, substrate tiles 110 are held in X and Y position using two or more registration features 142 (in accordance with one or more such embodiments, registration features 142 are mechanical registration fixtures that are affixed to the bottom of each substrate tile 110). Each of registration features 142 is engaged with a corresponding capture element 146, for example a tessellated aperture in a flat spring of registration sheet 136, thereby locking each substrate tile 110 in an X and Y position relative to registration sheet 136 (X and Y are orthogonal coordinates in the plane of registration sheet 136), and hence, with respect to adjacent ones of the substrate tiles. In accordance with one or more such embodiments, registration feature 142 is a circular cylinder that engages aperture 146 (capture element 146) in registration sheet 136 by insertion of registration feature 142 into capture element 146. Further, registration sheet 136 is held in position by registration ring 130. Preferably, registration sheet 136 is a flexible sheet of material selected from the group of invar, tungsten, molybdenum, low expansion material and combinations of these with other materials such as, for example and without limitation, silicon, titanium alloys, and nitinol. Further, a registration sheet having low thermal expansion that is more closely matched to the thermal expansion of DUT wafer 124 provides better registration of probe tips 122 to contact pads 126 (a contact pad is an electrical terminal on the bottom surface of a substrate) of DUT wafer 124 during high temperature testing.

In accordance with one or more such embodiments, each of substrate tiles 110 is supported on three or more posts 162 through intermediate registration features 142 affixed to the bottom surface of substrate tiles 110. Further, in accordance with one or more further embodiments, posts 162 support substrate tiles 110 directly, i.e., without intermediate registration features 142. Still further, in accordance with one or more still further embodiments, posts 162 support each of substrate tiles 110 through intermediate structures interposed between substrate tiles 110 and posts 162, wherein such intermediate structures may include substrates, flex cables, connector arrays, insulating layers, support blocks, and the like. Distal ends of posts 162 are sufficiently moveable in a radial direction to allow posts 162 to follow movement of registration features 142 as necessary for registration of substrate tiles 110 in the X and Y directions.

As shown in FIG. 1B, posts 162 are supported by actuators 160 (for example, actuators are mechanisms for displacing a post in an axial direction) that are anchored on frame 138 (for example, frame 138 is a mounting frame for the total assembly). In the embodiment shown in FIG. 1B, posts 162 are cylindrical posts, actuators 160 are hydraulic, and posts 162 are connected to pistons 166 of hydraulic reservoirs 164 (for example, hydraulic reservoirs 164 include cylinders 168). As one or ordinary skill in the art will readily appreciate, an increase in pressure of hydraulic fluid 170 will cause piston 166 to move in cylinder 168, thereby driving post 162 upward in a direction toward DUT wafer 124.

As further shown in FIG. 1B, fluid channels 172 (for example, a fluid channel is a tube or channel for flow of hydraulic fluid) from each of hydraulic reservoirs 164 connects hydraulic fluid in its associated hydraulic reservoir 164 through its associated fluid valve 174 and fluid channels 176 to other ones of hydraulic reservoirs 164. When valve control 178 (for example, a valve control is an actuation mechanism for valves) actuates opening of fluid valves 174, hydraulic fluid 170 is free to flow through channels 176, and between hydraulic reservoirs 164, to bring hydraulic pressure in each hydraulic reservoir 164 into equilibrium with pressure in others of hydraulic reservoirs 164. On the other hand, when valve control 178 actuates closing of fluid valves 174, hydraulic fluid 170 flow between hydraulic reservoirs 164 is blocked, thereby locking each piston 166 and attached post 162 in position in an axial direction along post 162. Thus, actuating valve control 178 to close fluid valves 174 acts to lock each of substrate tiles 110, and hence, probe tips 122 thereon, in a fixed orientation relative to test plane 118 by locking each of supporting posts 162 in a vertical position along the direction of the post axis. It is well known to those of ordinary skill in the art how to build hydraulic actuators and valve controls therefor to provide the functionality described above.

As shown in FIG. 1B, probe head 100 is built on frame 138 which is preferably made of stress free steel such as A2 steel. As further shown in FIG. 1B, spacer 134 supports printed circuit board 150 (for example, a printed circuit board or flex cable connecting to a substrate tile) on frame 138. As further shown in FIG. 1B, spacer 132 supports registration ring 130 and registration sheet 136. In accordance with one or more embodiments of the present invention, connectors 156 are held in tension thereby urging substrate tiles 110 and registration features 142 downward onto supporting posts 162.

In accordance with one or more embodiments of the present invention, actuation of valve control 178 to open fluid valves 174 allows fluid to flow from one hydraulic reservoir to another in response to various forces acting on posts 162, thereby allowing posts 162 to move relative to frame 138. In addition, connectors 156 stretch and shrink axially to allow substrate tiles 110, and hence, probe tips 122 thereon, to move and thereby to change orientation with respect to, and hence align with, test plane 118.

Figure 2A:
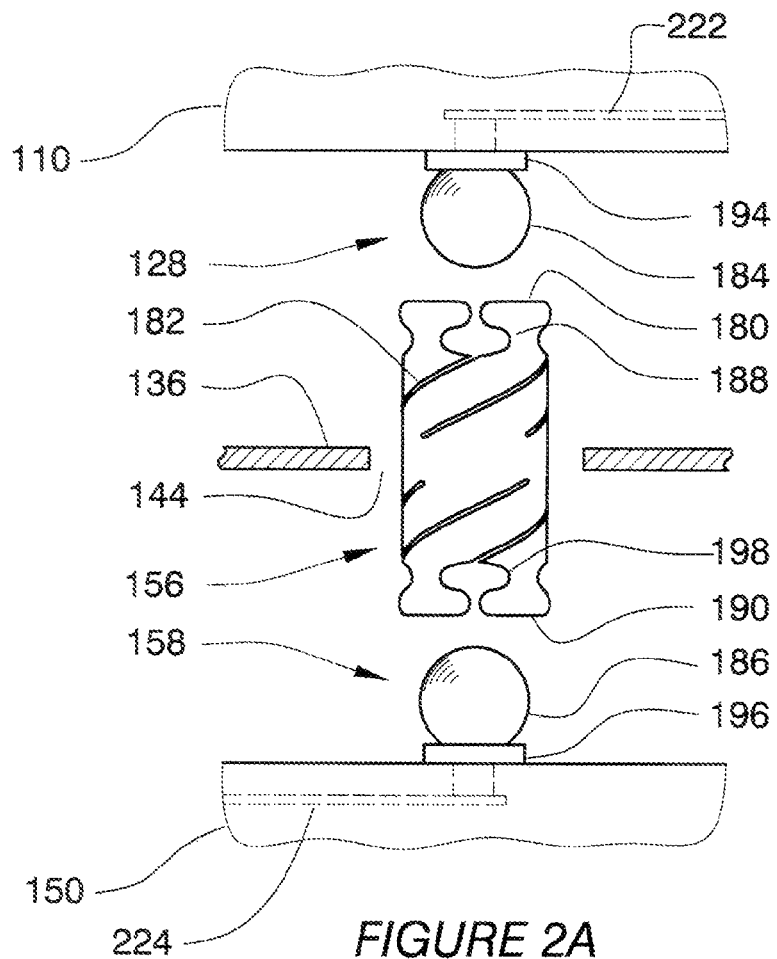
FIGS. 2A and 2B are partial sectional views of a connector in an unmated and in a mated configuration, respectively.
Figure 2B:
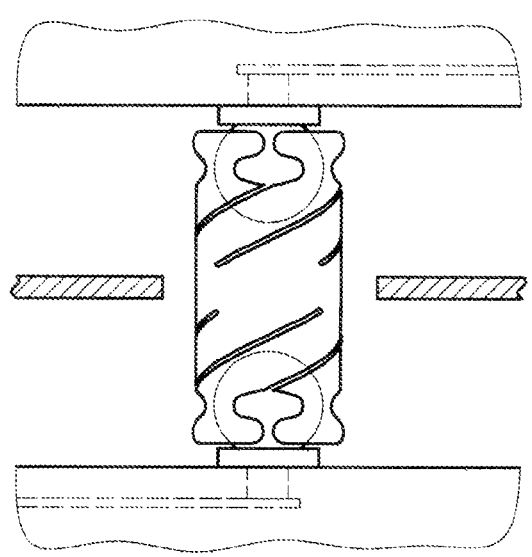

FIG. 2A shows a partial sectional view of connector 156 in an unmated configuration, and FIG. 2B shows a partial sectional view of connector 156 in a mated configuration. In accordance with one or more embodiments, connector 156 is a cylindrical metal tube with one or more helical cuts 182 through a cylindrical wall of connector 156. Connector 156 is provided with one or more slots 188 in top end 180. In accordance with one or more such embodiments, terminal 128 is a bulbous terminal (for example, a bulbous terminal is a ball terminal for engaging a tube connector) such as gold plated copper ball 184 that is thermocompression bonded to gold plated copper pad 194. Slots 188 are adapted to engage bulbous terminal 128 when the terminal is urged into mating with the top of connector 156 as shown in the mated configuration of FIG. 2B. Slot 188 has a maximum width at a defined distance from top end 180 such that a force is needed to disengage bulbous terminal 128 from connector 156. Preferably, the defined distance from top end 180 is about one half of the diameter of ball 184. Connector 156 may also have one or more slots 198 in bottom end 190, where slots 198 have a maximum width at a defined distance from bottom end 190. Similarly, slots 198 capture and hold bulbous terminal 158 that is urged into mating configuration with bottom end 190 of connector 156, as shown in FIG. 2B. In accordance with one or more embodiments, bulbous terminal 156 comprises gold plated copper ball 186 that is thermocompression bonded to gold plated copper pad 196. In the mated configuration shown in FIG. 2B, connector 156 provides a reliable electrical connection between terminal 128 and terminal 158 throughout a range of compression and extension of connector 156. In addition, variable width slots 188 and 198 capture and hold bulbous terminals 128 and 158, respectively, throughout a range of tensile and compressive forces in connector 156. As further indicated in FIGS. 2A and 2B, in probe head 100, each of connectors 156 protrudes through a hole (hole 144) in registration sheet 136, thereby allowing sheet 136 to cover the area between printed circuit board 150 and substrate tiles 110 without the need for windows or large apertures for substrate tiles 150. In accordance with one or more alternative embodiments, connector 156 may be a spring pin, a wire spring, a POGO® pin (POGO is a registered trademark of Everett Charles Technologies of Pomona, Calif.), or other miniature spring connector.

As shown in FIG. 2B, probe tips 122 are coupled electrically to terminals 128 by circuit traces 222 (for example, circuit traces are copper networks in circuit boards, cables, and so forth or conductive vias) in substrate tiles 110. During the process of testing DUT wafer 124, one or more electrical signals are introduced from test equipment into traces 224 in printed circuit board 150 (refer to FIG. 2A) which distribute the signals to appropriate ones of terminals 158. Connectors 156 conduct signals from terminals 158 to corresponding ones of terminals 128 on substrate tiles 110, to circuit traces 222, and to probe tips 122, thereby transmitting one or more test signals from printed circuit board 150 to probe tips 122. One or more response signals generated by a device under test (DUT) on wafer 124 during the process of testing are returned to test equipment by being in contact with selected ones of probe tips 122, being transmitted through traces 222 in substrate tiles 110, and being conducted through connectors 156 to traces 224 in printed circuit board 150 which transmit the responses to test equipment (not shown).

The process of testing DUT wafer 124 may be understood by reference to FIG. 1B. As shown in FIG. 1B, probe tips 122 on probe head 100 are aligned with corresponding pads 126 on DUT wafer 124. Probe head 100 is then urged against the substantially flat surface of DUT wafer 124, bringing each probe tip 122 into contact with a corresponding one of pads 126 on DUT wafer 124. Valve control 178 is then actuated to open fluid valves 174, allowing hydraulic fluid 170 to flow between hydraulic reservoirs 164, and thereby, allowing posts 162 to move axially in response to forces transmitted by substrate tiles 110 to supporting posts 162. As probe tips 122 on substrate tiles 110 are urged against mating pads 126, force is transmitted through posts 162 to hydraulic pistons 166, which, in turn, increases pressure in hydraulic fluid 170 in hydraulic reservoirs 164. In response, substrate tiles 110, and hence, probe tips 122 thereon, change orientation until hydraulic pressure is equalized among hydraulic reservoirs 164, thereby bringing probe tips 122 on the top surface of each substrate tile 110 to be substantially coplanar with test plane 118 on DUT wafer 124. After probe tips 122 on substrate tiles 110 are brought into a substantially coplanar orientation with test plane 118, valve control 178 is actuated to close fluid valves 174, thereby locking the orientation of each of substrate tiles 110 so that probe tips 122 thereon are coplanar with test plane 118.

Electrical tests are then performed on DUT wafer 124 by transmitting signals through traces 224 in printed circuit board 150, through connectors 156, through traces 222 in substrates 110 to selected ones of probe tips 122, and on to pads 126 on DUT wafer 124. Test results are determined by sensing response signals conducted from pads 126 on DUT wafer 124 to probe tips 122, through traces in substrate tiles 110, through connectors 156, and to traces in printed circuit board 150 that connect to test equipment (not shown).

Substrate tiles 110 are held in a locked position while DUT wafer 124 is removed from probe head 100 and a second DUT wafer is brought into position in juxtaposition to probe head 100. Probe head 100 is then urged against the second DUT wafer, bringing substantially co-planar probes 122 into contact with mating pads on the second wafer. The wafer may be heated to test the DUT chips at high temperature wherein the wafer and probe head 100 may warp, distort and shift orientation due to thermal expansion. During the heating process, valve control 178 may be actuated to open fluid valves 174 to allow flow of hydraulic fluid 170 to equalize fluid pressure in hydraulic reservoirs 164, thereby allowing substrate tiles 110 to reorient so that probe tips 122 are substantially coplanar to test plane 118 as substrate tiles 110 respond to pressure placed by wafer pads on probe tips 122. After the test is complete, valve control 178 is actuated to close valves 174 and lock substrate tiles 110 in position to be ready for testing the next DUT wafer.

While embodiments described above in conjunction with FIGS. 1A and 1B employ hydraulic actuators 160 of equal size, in accordance with one or more further embodiments, the size and placement of the hydraulic actuators can be designed by one of ordinary skill in the art to provide a substantially equal force on each of probe tips 122 pressing against pads 126 on DUT wafer 124 when the hydraulic pressure within each actuator is equal. Further, in accordance with one or more still further embodiments, the substrate tiles that make up the probe head may be of any number and size. Still further, in accordance with one or more yet still further embodiments, substrate tiles or partial substrate tiles may be linked together to make composite substrate tiles. By way of example, substrate tiles at the borders of a DUT wafer may contain a small number of probe tips; or a number of partial substrate tiles may be rigidly linked to form a composite substrate tile with a larger total number of probe tips.

Figure 3A:
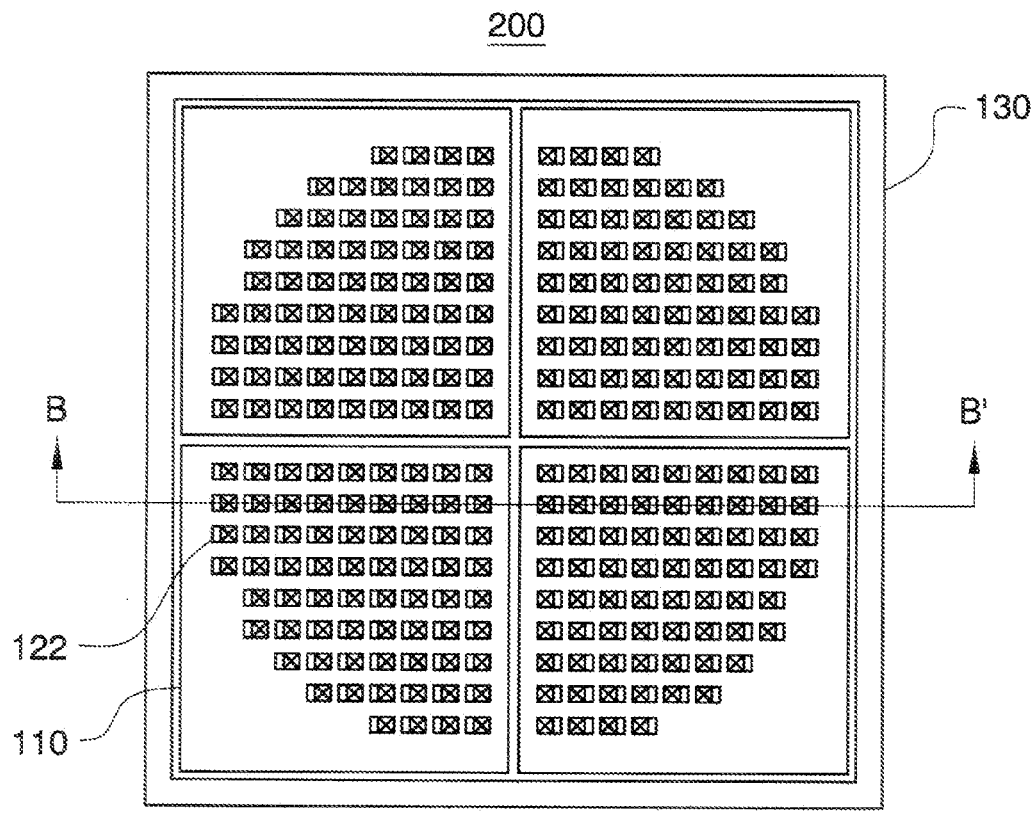
FIG. 3A is a top view of a probe head that is fabricated in accordance with one or more further embodiments of the present invention.
Figure 3B:
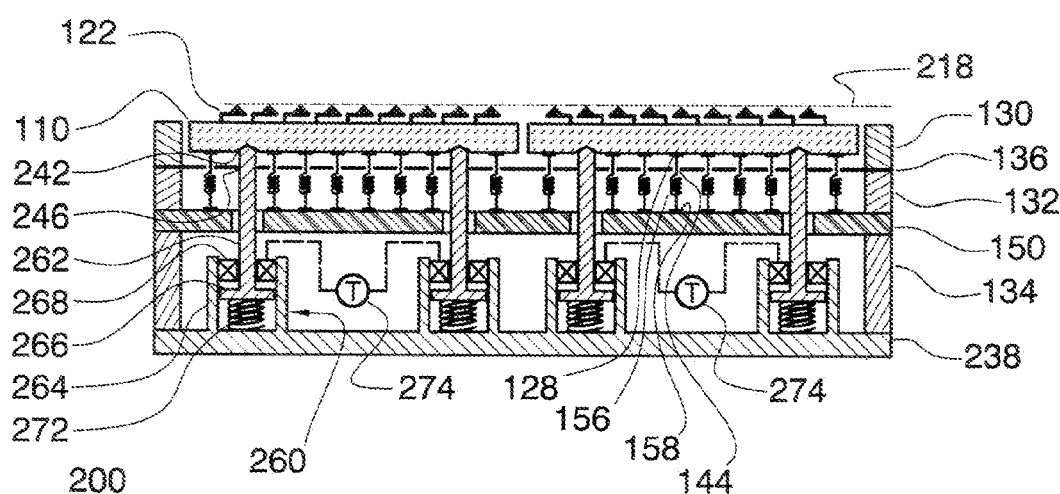
FIG. 3B is a cross-sectional of the probe head shown in FIG. 3A, the cross-section being taken along a line between, and in a direction of, arrows B and B' of FIG. 3A.

FIG. 3A is a top view of probe head 200 that is fabricated in accordance with one or more further embodiments of the present invention, and FIG. 3B is a cross-sectional view of probe head 200, the cross-section being taken along a line between, and in a direction of, arrows B and B' of FIG. 3A. As shown in FIG. 3B, electromechanical actuators 260 support substrate tiles 110 on posts 262. As further shown in FIG. 3B, substrate tiles 110 are held in X and Y position, for example and without limitation, with respect to adjacent ones of substrate tiles 110 so that probe tips 122 are held in X and Y registration in test plane 218, and substrate tiles 110 are aligned so that probe tips 122 thereon are substantially coplanar to test plane 218 (i.e., to a portion of test plane 218 to which they are adjacent) by a registration-alignment apparatus comprised of registration and alignment mechanisms. As shown in FIG. 3B, substrate tiles 110 are held in X and Y position using registration features 242 that mate with respective ones of posts 262, and posts 262 are held in place in X and Y position by apertures 246 (capture elements 246) in registration sheet 136 mounted to registration ring 130 (registration ring 130 is supported on spacer 132). In accordance with one or more alternative such embodiments, each of substrate tiles 110 is held in X and Y position using two or more registration features on the bottom of substrate tile 110, wherein each of the registration features is engaged with a corresponding capture element of registration sheet 136 (for example, a capture element may be an aperture that holds registration features in place). In accordance with one or more such alternative embodiments, preferably, registration feature 242 is a circular cylinder and capture element 246 is a tessellated flat spring aperture in registration sheet 136. By convention, the X and Y directions are orthogonal directions in a plane such as test plane 218.

As shown in FIG. 3B, actuator 260 is an electromagnetic actuator comprising spring 272, piston 266, and electromagnetic clutch 268. When electromagnetic clutch 268 is released by a signal from controller 274, post 262 is free to move in an axial direction as allowed by tension in spring 272. When each of clutches 268 is released, substrate tiles 110 move and change orientation in response to vertical forces on each substrate tile 110. The orientation of substrate tiles 110 may be adjusted to bring probe tips 122 into coplanar alignment on test plane 218 by urging probe tips against a flat surface such as a wafer. After probe tips 122 are in coplanar alignment, each electromagnetic clutch 268 is set by actuation by a signal from controller 274, thereby locking posts 262 and supporting substrate tiles 110 in position. Probe tips 122 remain in coplanar alignment until such time that electromagnetic clutches 268 are released by controller 274. Thus, the substrate tiles may be leveled and locked in position to provide an array of coplanar probe tips 122 ready for contacting a DUT wafer. Although a preferred embodiment utilizes electromagnetic clutch actuator 260, further embodiments may be fabricated utilizing other types of actuators including, for example and without limitation, piezoelectric actuators, piezoelectric clutch actuators, pneumatic actuators, hydraulic actuators, magnetostrictive actuators, electromagnetic actuators, and other actuators known in the art. It is well known to those of ordinary skill in the art how to build electromagnetic actuators and controllers therefor to provide the functionality described above, as well as for the other types of actuators listed above.

As shown in FIG. 3B, registration sheet 136 contains apertures 144 that allow clearance for connectors 156 to pass through registration sheet 156. In accordance with one or more embodiments, connector 156 is a tubular connector as in FIGS. 2A and 2B. Further, tubular connectors 156 act to urge substrate tiles 110 against posts 262 when connector 156 is under tension, thereby maintaining substrate tiles 110 in position on posts 262. In operation, posts 262 urge upward against substrate tiles 110 and, as a result, put tension on tubular connectors 156. Posts 262 are then locked in position, maintaining the position and orientation of the substrate tiles.

Electrical signals in the embodiment of FIG. 3B are handled as they were in the embodiment of FIG. 1B. In particular, signals from probe tips 122 are transmitted by traces in substrate tiles 110 to corresponding ones of terminals 128. Signals are transmitted from terminals 128 by way of connectors 156 to corresponding ones of terminals 158 on printed circuit board 150. Traces in printed circuit board 150 then transmit signals to test equipment (not shown) connected to printed circuit board 150.

Figure 4A:
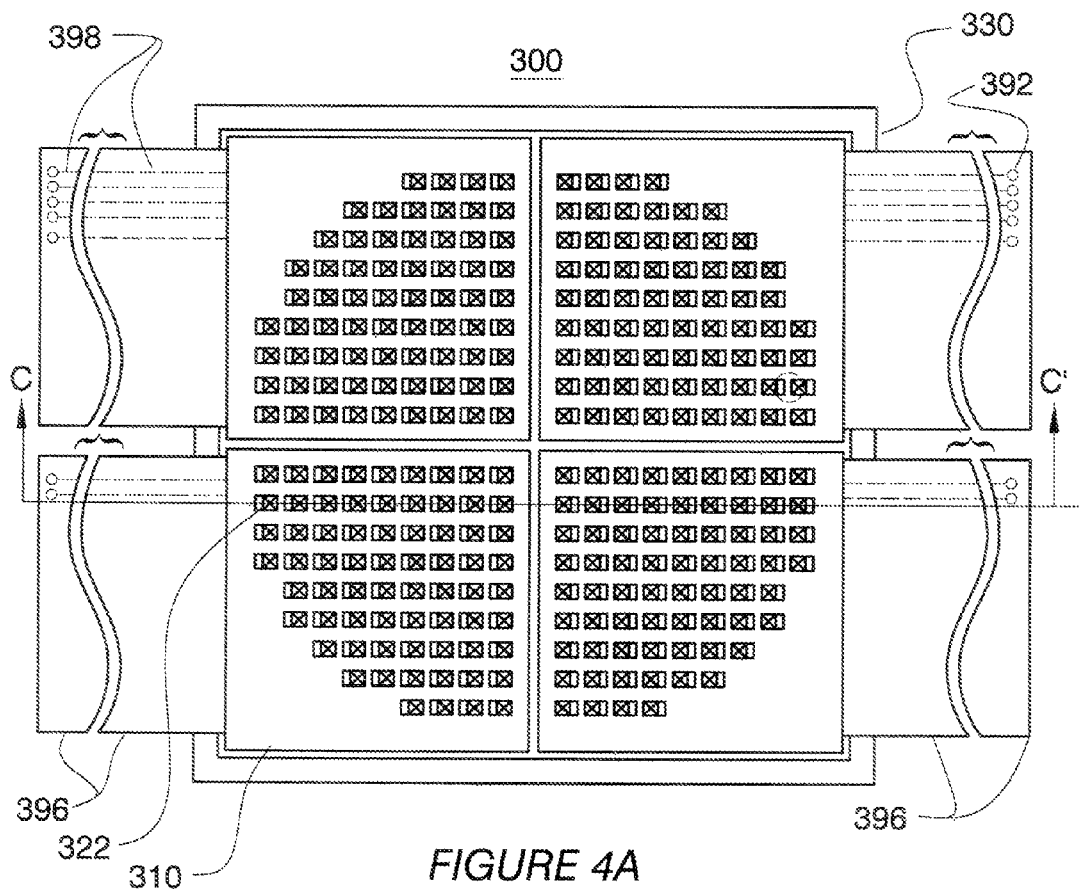
FIG. 4A is a top view of a probe head that is fabricated in accordance with one or more still further embodiments of the present invention.
Figure 4B:
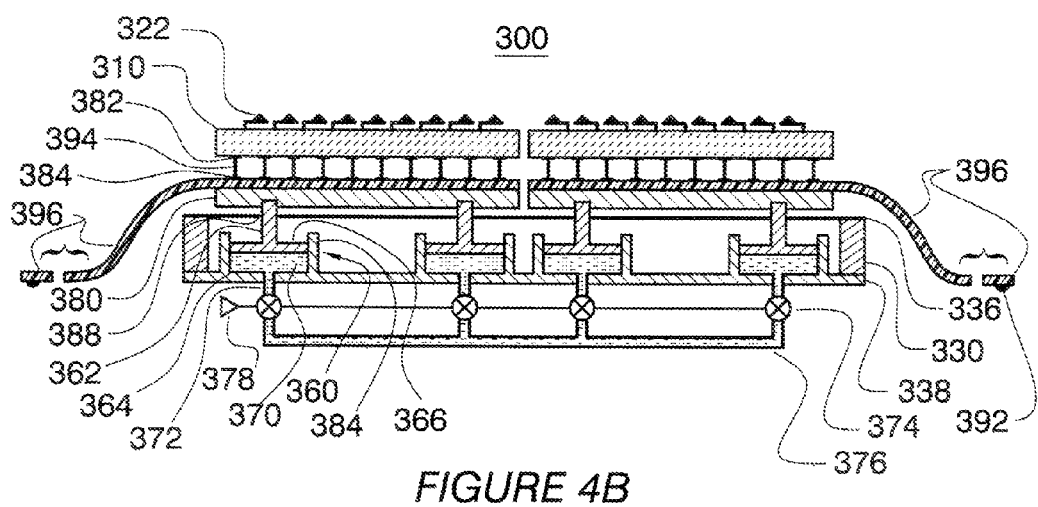
FIG. 4B is a simplified side cross-sectional view of the probe head shown in FIG. 4A, the cross-section being taken along a line between, and in a direction of, arrows C and C' of FIG. 4A.

FIG. 4A is a top view of probe head 300 that is fabricated in accordance with one or more further embodiments of the present invention, and FIG. 4B is a cross-sectional view of probe head 300, the cross-section being taken along a line between, and in a direction of, arrows C and C' of FIG. 4A. As shown in FIG. 4B, an assembly comprising: (a) substrate tiles 310 and associated probe tips 322; (b) an array of conductive links 394; (c) printed wiring layer and associated flex cable 396; and (d) mounting blocks 380 may be replaceable as a unit. As further shown in FIG. 4B, substrate tiles 310 are held in X and Y position, for example and without limitation, with respect to adjacent ones of substrate tiles 310 so that probe tips 322 are held in X and Y registration in a test plane, and substrate tiles 310 are aligned so that probe tips 322 thereon are substantially coplanar to the test plane (i.e., to a portion of the test plane to which they are adjacent) by a registration-alignment apparatus comprised of registration and alignment mechanisms. As shown in FIG. 4B, substrate tiles 310 are held in X and Y position using two or more registration features held in place by apertures 388 (capture elements 388 being preferably serpentine flat spring segments cut into the material of registration sheet 336) in registration sheet 336. Registration sheet 336 is mounted on registration ring 330 that is supported on frame 338.

As shown in FIG. 4B, two or more registration features held in place by apertures 388 are three or more posts 362 that are mechanically connected to the bottom of, and mechanically support, mounting block 380, for example and without limitation, by insertion into a recess therein.

In accordance with one or more such embodiments, test signals are transmitted to probe tips 322 by traces 398 (refer to FIG. 4A) in flex cables 396 that connect probe head 300 to test electronics (not shown). Signals in traces 398 are conducted through conductive links 394 to terminals 382 on the bottom of substrate tiles 310, and then to probe tips 322 by traces in substrate tiles 310. Each substrate tile 310 is supported on mounting block 380 by conductive links 394 which couple terminals 382 on substrate tiles 310 to terminals 384 on flex cable 396, and flex cable 396 is supported in turn by, for example and without limitation, attachment to, mounting block 380 (using any one of a number of methods well known to those of ordinary skill in the art, including, for example and without limitation, attachment by means of laminated Pyralux® bond ply adhesive materials available from DuPont Electronic Materials of Research Triangle Park, N.C.), and each mounting block 380 is supported as described above on three or more posts 362. In accordance with one or more such embodiments, mounting block 380 is rigid and may be fabricated of a ceramic or a metal material, wherein the material preferably has a low coefficient of thermal expansion ("CTE"). More preferably, mounting block 380 is fabricated of materials selected from the group including alumina, aluminum nitride, invar, kovar, and other low CTE nickel alloys.

As further shown in FIG. 4B, posts 362 are supported on actuators 360 that are mounted to rigid frame 338. The frame material is preferably selected from a group consisting of invar, Anviloy (available from CMW, Inc., of Indianapolis, Ind.), A2 steel, 316 stainless steel, and other stainless steel materials. Actuator 360 is preferably a hydraulic cylinder wherein post 362 is attached to piston 366 that seals hydraulic fluid 370 in cylinder 384. Each hydraulic reservoir 364 is connected by fluid channel 372 through fluid valve 374 to fluid channel 376 interconnecting each hydraulic reservoir 364 with others of hydraulic reservoirs 364. Each of fluid valves 374 is actuated by valve control 378 whereby fluid valves 374 can be closed off, thereby sealing each hydraulic reservoir 364 and locking piston 366 and connected post 362 in position along an axial direction. In another aspect of operation, fluid valves 374 can be opened by activating valve control 378, thereby allowing fluid intercommunication among hydraulic reservoirs 364 and freeing pistons 366 and attached posts 362 to move in an axial direction. By this modality, fluid valves 374 may be opened to align probe tips 322 on substrate tiles 310 to mutual coplanarity, after which, fluid valves 374 may be closed to lock substrate tiles 310, and hence, probe tips 322 thereon, in alignment.

As those of ordinary skill in the art can readily appreciate from the description herein, an alternative embodiment of probe head 300 exists wherein registration features are affixed to the bottom of mounting blocks 380, which registration features engage capture elements in a registration sheet in the manner described above regarding probe head 100.

Figure 4C:
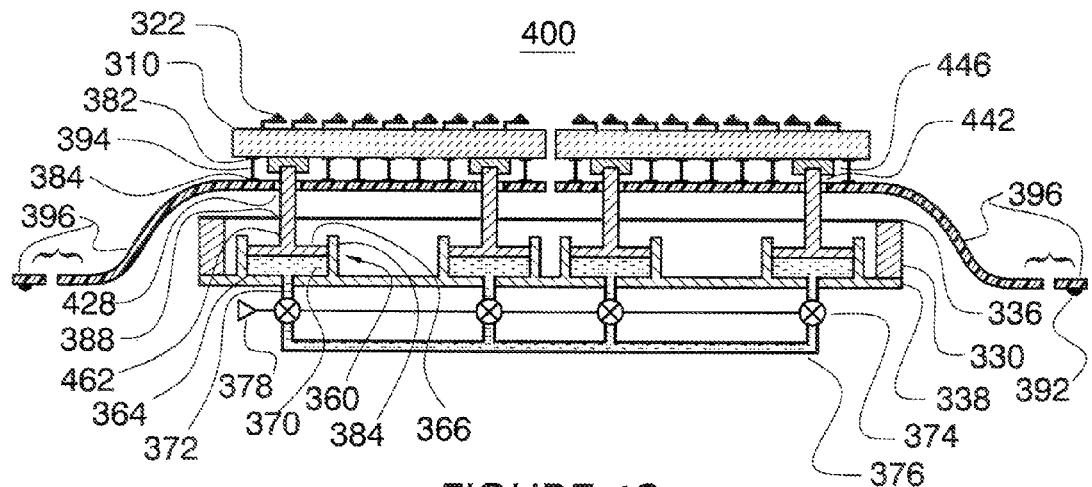
FIGS. 4C-4H are simplified side cross-sectional views of probe heads that are fabricated in accordance with one or more yet still further embodiments of the present invention.

FIG. 4C is a cross-sectional view of probe head 400, the cross-section being taken along a line to provide a view similar to the one shown in FIG. 4A. As shown in FIG. 4C, printed wiring layer and associated flex cable 396 is held by an array of conductive links 394 connecting terminals 382 on substrate tiles 310 to terminals 384 on flexible printed wiring layer 396. Contact terminals 392 are arrayed on a distal end of flexible printed wiring layer 396 on an extension shown with brackets in FIG. 4C. As further shown in FIG. 4C, substrate tiles 310 are held in X and Y position, for example and without limitation, with respect to adjacent ones of substrate tiles 310 so that probe tips 322 are held in X and Y registration in a test plane, and substrate tiles 310 are aligned so that probe tips 322 thereon are substantially coplanar to the test plane (i.e., to a portion of the test plane to which they are adjacent) by a registration-alignment apparatus comprised of registration and alignment mechanisms. As shown in FIG. 4C, substrate tiles 310 are held in X and Y position using two or more registration features held in place by tessellated apertures 388 in registration sheet 336. Registration sheet 336 is mounted on registration ring 330 that is supported on frame 338.

In accordance with one or more such embodiments, each substrate tile 310 is supported on three or more posts 462; wherein the two or more registration features held in place by apertures 388 are two or more of the three or more posts 462. As shown in FIG. 4C, each post of a group of three or more posts 362 passes through apertures 428 in flex cables 396, and is mechanically connected to one of registration features 446 attached to the bottom of substrate tile 310, and thereby mechanically supports substrate tile 310. Distal ends of posts 362 are held in place on substrate tiles 310 by attachment sockets 442 in registration features 446.

As further shown in FIG. 4C, posts 362 are supported on actuators 360 that are mounted to rigid frame 338. The manner in which substrate tiles 310 are aligned so that probe tips 322 thereon are substantially coplanar to a test plane by posts 362 and actuators 360 can readily be understood in light of the descriptions provide herein.

Figure 4D:
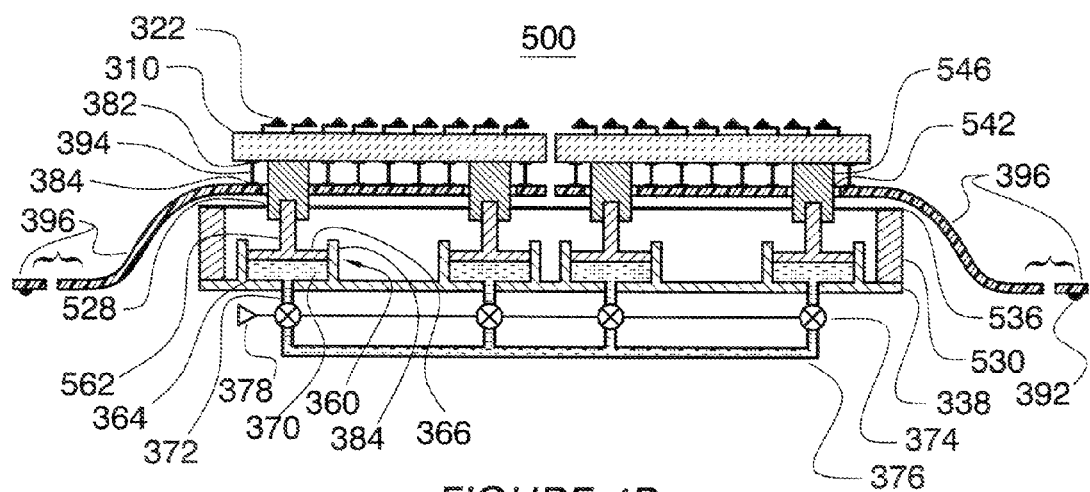

FIG. 4D is a cross-sectional view of probe head 500, the cross-section being taken along a line to provide a view similar to the one shown in FIG. 4C. As shown in FIG. 4D, printed wiring layer and associated flex cable 396 is held by an array of conductive links 394 connecting terminals 382 on substrate tiles 310 to terminals 384 on flexible printed wiring layer 396. Contact terminals 392 are arrayed on a distal end of flexible printed wiring layer 396 on an extension shown with brackets in FIG. 4D. As further shown in FIG. 4D, substrate tiles 310 are held in X and Y position, for example and without limitation, with respect to adjacent ones of substrate tiles 310 so that probe tips 322 are held in X and Y registration in a test plane, and substrate tiles 310 are aligned so that probe tips 322 thereon are substantially coplanar to the test plane (i.e., to a portion of the test plane to which they are adjacent) by a registration-alignment apparatus comprised of registration and alignment mechanisms. As shown in FIG. 4D, substrate tiles 310 are held in X and Y position using two or more registration features 546 that: (a) are affixed to the bottom surface of each substrate tile 310; (b) pass through apertures 542 in flex cables 396; and (c) are held in place by apertures 528 (capture elements 528) in registration sheet 536. Registration sheet 536 is mounted on registration ring 530 that is supported on frame 338.

In accordance with one or more such embodiments, each substrate tile 310 is supported on three or more posts 562. As shown in FIG. 4D, each post of a group of three or more posts 562 is mechanically connected to one of registration fixtures 546 attached to the bottom of substrate tile 310, and thereby mechanically supports substrate tile 310. Distal ends of posts 562 are held in place on substrate tiles 310 by attachment sockets in registration features 546.

As further shown in FIG. 4D, posts 562 are supported on actuators 360 that are mounted to rigid frame 338. The manner in which substrate tiles 310 are aligned so that probe tips 322 thereon are substantially coplanar to the test plane by posts 562 and actuators 360 can readily be understood in light of the descriptions provide herein.

Figure 4E:
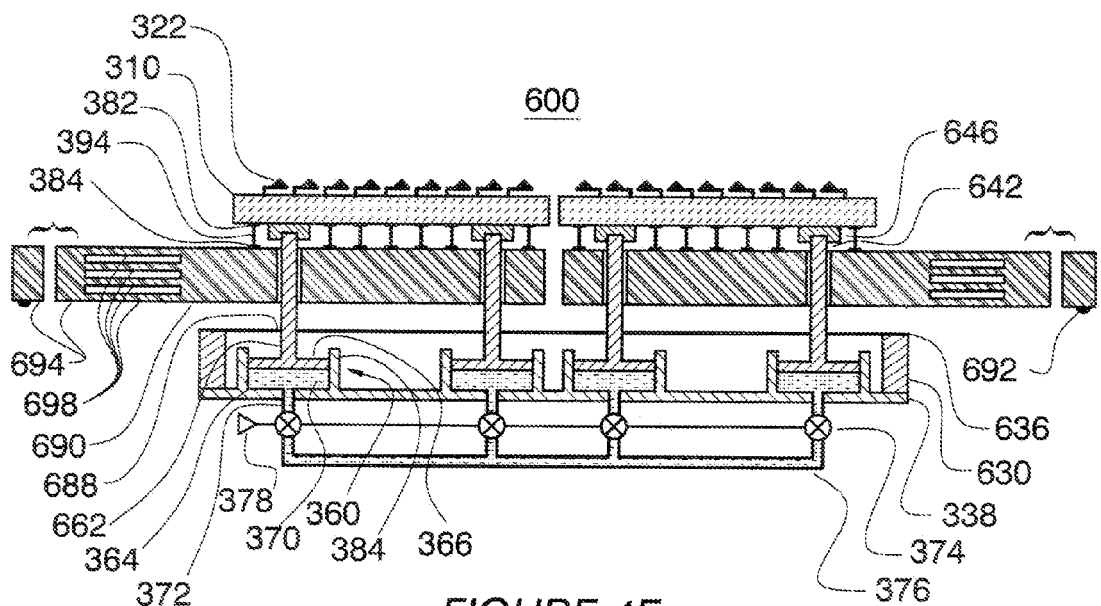

FIG. 4E is a cross-sectional view of probe head 600, the cross-section being taken along a line to provide a view similar to the one shown in FIG. 4C. As shown in FIG. 4E, compliant printed circuit board 690 is held by an array of conductive links 394 connecting terminals 382 on substrate tiles 310 to terminals 384 on printed circuit board 690. Contact terminals 692 are arrayed on a distal end of printed circuit board 690 on an extension shown with brackets in FIG. 4E. As further shown in FIG. 4E, substrate tiles 310 are held in X and Y position, for example and without limitation, with respect to adjacent ones of substrate tiles 310 so that probe tips 322 are held in X and Y registration in a test plane, and substrate tiles 310 are aligned so that probe tips 322 thereon are substantially coplanar to the test plane (i.e., to a portion of the test plane to which they are adjacent) by a registration-alignment apparatus comprised of registration and alignment mechanisms. As shown in FIG. 4E, substrate tiles 310 are held in X and Y position using two or more registration features held in place by circular apertures forming capture elements 688 in registration sheet 636. Registration sheet 636 is mounted on registration ring 630 that is supported on frame 338.

In accordance with one or more such embodiments, each substrate tile 310 is supported on three or more posts 662; wherein the two or more registration features held in place by capture elements 688 are two or more of the three or more posts 662. As shown in FIG. 4E, each post of a group of three or more posts 662 passes through apertures in printed circuit board 690, and is mechanically connected to one of fixtures 646 attached to the bottom of substrate tile 310, and thereby mechanically supports substrate tile 310. Distal ends of posts 662 are held in place on substrate tiles 310 by attachment sockets 642 in fixtures 646.

As shown in FIG. 4E, selected portions of printed circuit board 690 are comprised of compliant foliated layers 698. In accordance with one or more embodiments of the present invention, foliated layers 698 are thin layers of laminate material, for example, thin printed wiring layers, which are not joined by adhesive material. Signals from probes 322 are conducted through traces and vias in substrate tiles 310, through conductive links 394, through traces and vias in printed wiring board 690 (for example, through traces in foliated layers 698), and through printed circuit board areas 694 to contact terminals 692. Electrical signals are transmitted to probes 322 and received from probes 322 by electrical test equipment connected to contact terminals 692.

As further shown in FIG. 4E, posts 662 are supported on actuators 360 that are mounted to rigid frame 338. The operation of actuators 360 of probe head 600 is similar to that described herein for probe head 300. In particular, in operation, as substrate tiles 310 move vertically during operation of probe head 600, portions of printed circuit board 690 also move vertically. Specifically, printed circuit board areas 694 and associated contacts 692 are held fixed in position by mating contacts and support structure (not shown) while portions of printed circuit board 690 are free to move vertically because of the use of compliant foliated layers 698. Preferably conductive link 394 is connector 156 as shown in FIG. 2A, and terminal 382 and terminal 384 are terminal 128 and terminal 158, respectively, shown in FIG. 2A. For such a preferred embodiment, mating and unmating conductive links 394 to terminals 382 and terminals 384 allows substrate tiles 310 to be mounted and unmounted on printed circuit board 690. Alternatively, connector 156 may be permanently attached to terminal 158 on printed circuit board 690 by means of solder, thermocompression bonding, thermosonic bonding or the like. Connector 156 may be permanently attached to terminal 128 on substrate tile 310.

Figure 4F:
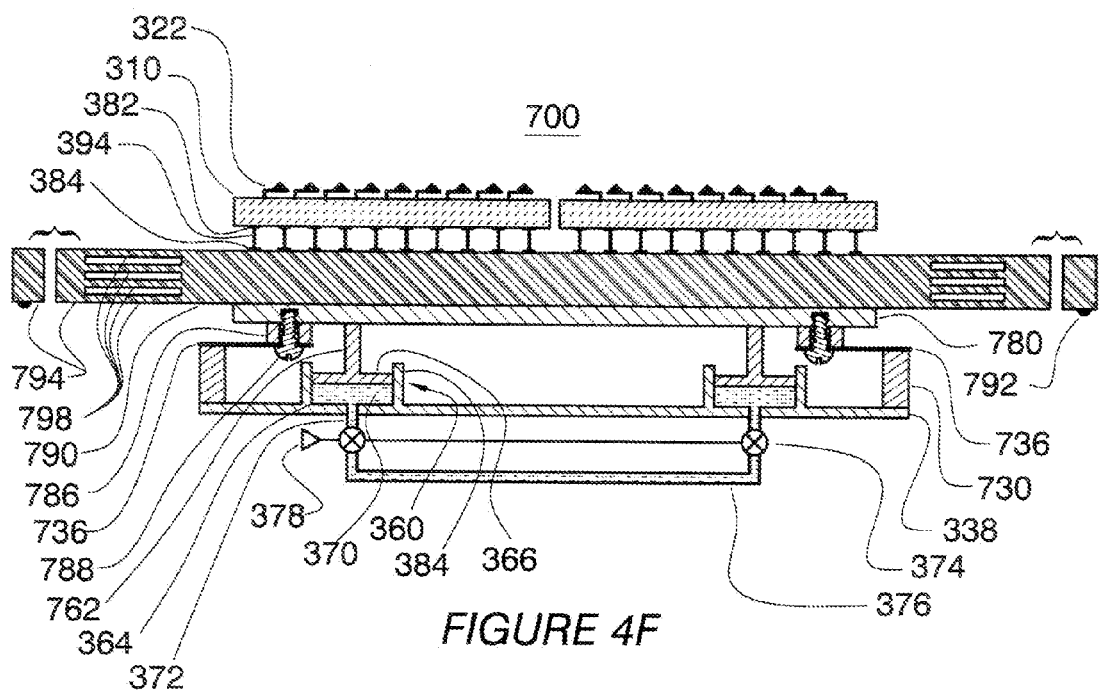

FIG. 4F is a cross-sectional view of probe head 700, the cross-section being taken along a line to provide a view similar to the one shown in FIG. 4B. As shown in FIG. 4F, compliant printed circuit board 790 is held by an array of conductive links 394 connecting terminals 382 on substrate tiles 310 to terminals 384 on printed circuit board 790. Contact terminals 792 are arrayed on a distal end of printed circuit board 790 on an extension shown with brackets in FIG. 4F. As further shown in FIG. 4F, substrate tiles 310 are held in X and Y position, for example and without limitation, with respect to adjacent ones of substrate tiles 310 so that probe tips 322 are held in X and Y registration in a test plane, and substrate tiles 310 are aligned so that probe tips 322 thereon are substantially coplanar to the test plane (i.e., to a portion of the test plane to which they are adjacent) by a registration-alignment apparatus comprised of registration and alignment mechanisms. As shown in FIG. 4F, substrate tiles 310 are held in X and Y position by conductive links 394. Further, an assembly comprised of substrate tiles 310 attached to printed circuit board 790 and stiffener plate 780 (printed circuit board 790 is supported by, for example and without limitation, attachment to, stiffener plate 780 using any one of a number of methods well known to those of ordinary skill in the art including, for example and without limitation, by means of selected areas of silicone adhesive DC577 available from Dow Corning of Midland, Mich.) is held in position in X and Y using registration features attached to two or more flat springs 736 that mechanically link stiffener plate 780 to frame 338. As shown in FIG. 4F: (a) one end of flat spring 736 is attached to a registration feature disposed on a bottom surface of stiffener plate 780 (for example, a threaded recess) by fastener 788, for example, a screw, and spacer post 786 (a capture element); and (b) the other end of flat spring 736 is attached to registration ring 730. Lastly, substrate tiles 310 are supported on three or more posts 762 that are moveably attached to frame 338 by means of actuators 360.

In operation, substrate tiles 310 and printed circuit board 790 move vertically during operation of probe head 700 when a control signal from controller 378 releases actuator 360 by opening fluid valves 374. Flat springs 736 flex to allow stiffener plate 780 a range of vertical motion relative to fixed frame 338. Further, in the manner described above: (a) substrate tiles 310 are supported in a vertical direction by posts 762, where the vertical direction is a direction substantially along an axis of posts 762, and support of substrate tiles 310 is through intervening conductive links 394, printed circuit board 790, and stiffener plate 780; and (b) substrate tiles 310 may be set in a fixed vertical position by sending a control signal to close fluid valves 374, thereby locking actuators 360.

Selected portions of printed circuit board 790 are comprised of compliant foliated layers 798. In accordance with one or more embodiments of the present invention, foliated layers 798 are thin layers of laminate material, for example, thin printed wiring layers, which are not joined by adhesive material. As such, compliant foliated layers 798 of printed circuit boards 790 provide vertical compliance to allow printed circuit board 790 to move so as to level probe tips 322 to be coplanar with a test plane.

Signals from probes 322 are conducted through traces and vias in substrates 310, through conductive links 394, through traces and vias in printed wiring board 790 (i.e., through traces in foliated layers 798), and through printed circuit board areas 794 to contact terminals 792. Electrical signals are transmitted to probes 322 and received from probes 322 by electrical test equipment (not shown) connected to contact terminals 792. Printed circuit board areas 794 and associated contacts 792 are held fixed in position by mating contacts and support structure (not shown) while portions of printed circuit board 790 are free to move vertically because of the use of compliant foliated layers 798.

The manner in which substrate tiles 310 are aligned so that probe tips 322 thereon are substantially coplanar to the test plane by posts 762, actuators 360, stiffener plate 780, and printed circuit board 790 can readily be understood in light of the descriptions provided herein.

Preferably conductive link 394 is connector 156 as shown in FIG. 2A, and terminal 382 and terminal 384 are terminal 128 and terminal 158, respectively, shown in FIG. 2A. For such a preferred embodiment, mating and unmating conductive links 394 to terminals 382 and terminals 384 allows substrate tiles 310 to be mounted and unmounted on printed circuit board 790.

Figure 4G:
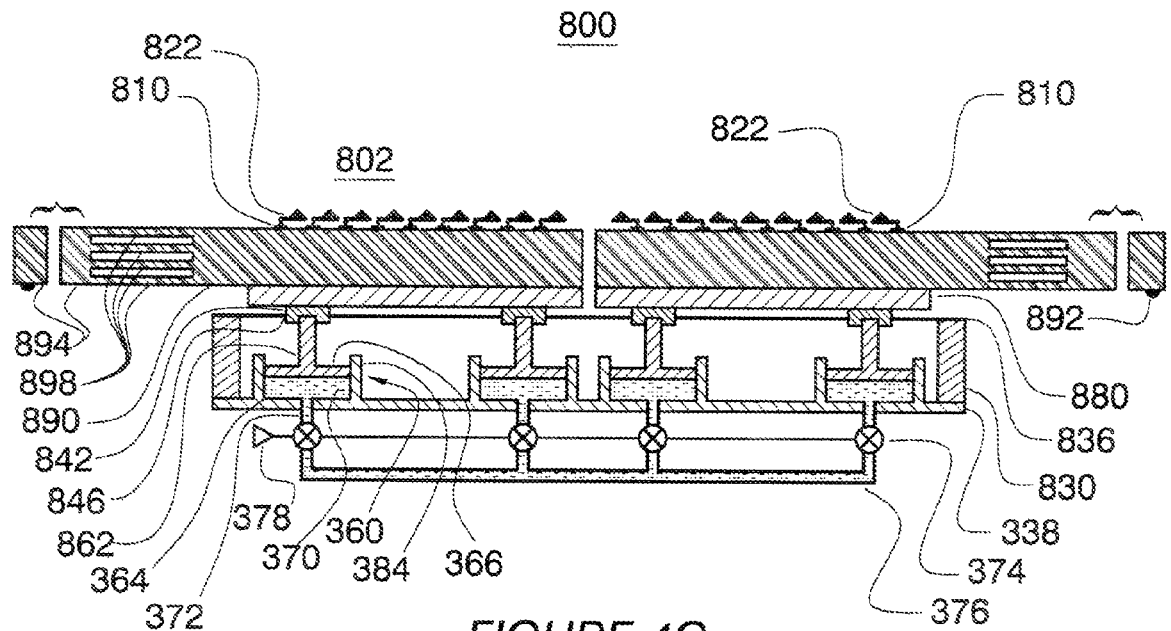

FIG. 4G is a cross-sectional view of probe head 800, the cross-section being taken along a line to provide a view similar to the one shown in FIG. 4B. In accordance with one or more embodiments of the present invention, probe tips 822 on each printed circuit board 890 are held in X and Y registration in a test plane, for example and without limitation, with respect to adjacent ones of printed circuit boards 890, and are aligned substantially coplanar to the test plane (i.e., to a portion of the test plane to which they are adjacent) by a registration-alignment apparatus comprised of registration and alignment mechanisms. As shown in FIG. 4G, probe subassemblies 802 comprise: (a) printed circuit boards 890; (b) probe tips 822 mounted to contact pads 810 on printed circuit boards 890; (c) stiffener plates 880 mounted to, for example, by attachment, printed boards 890 using any one of a number of methods well known to those of ordinary skill in the art including, for example and without limitation, bonding by means of a layer of compliant adhesive such as DC 577 available from Dow Corning of Midland, Mich.; and (d) registration features 842 attached to stiffener plates 880. As further shown in FIG. 4G, each of printed circuit boards 890 is supported on three or more posts 862 through interposed elements including registration features 842 and stiffener plates 880. In accordance with one or more embodiments of the present invention, probe subassemblies 802 (and hence probe tips 822) are held in X and Y registration using two or more registration features 842 that engage with corresponding apertures 846 (capture elements 846) in registration sheet 836. Apertures 846 may be simple circular holes, flat serpentine springs, or other capture elements adapted to hold registration features 842 in registration in X and Y directions. Although a preferred embodiment of 800 contemplates that registration features 846 may be inserted and removed from apertures 846, alternative embodiments provide registration features 846 that are permanently attached to registration sheet 836 by fasteners, adhesives, spot welding and the like. In accordance with one or more embodiments of the present invention, registration sheet 836 may be a thin flexible sheet of low thermal expansion metal that flexes sufficiently to allow a small vertical motion of engaged alignment features 842. As shown in FIG. 4G, registration sheet 836 is held by registration ring 830 in X and Y position with respect to rigid frame 338.

As shown in FIG. 4G, portions of printed circuit boards 890 are comprised of compliant foliated layers 898. In accordance with one or more embodiments of the present invention, foliated layers 898 are thin layers of laminate material, for example, thin printed wiring layers, which are not joined by adhesive material. As such, compliant foliated layers 898 of printed circuit boards 890 provide vertical compliance to allow each of printed circuit boards 890 to move to enable probe tips 822 to be coplanar with a test plane. Printed circuit board areas 894 and associated contact terminals 892 are held in fixed position by mating contacts and support structure (not shown).

Probe subassembly 802 may be removed from probe head 800 for rework or repair, and then replaced by mounting probe subassembly 802 onto probe head 800 such that registration features 842 are engaged with capture elements 846. For probe head 800 shown in FIG. 4G, registration feature 842 is a right circular cylinder with an indent for receiving post 862, and capture element 846 is an aperture in registration sheet 836. Other configurations for registration feature 842 and capture element feature 846 may be used, including, for example, use of a tessellated flat spring aperture for capture feature 846 that holds an registration feature 842 having a tapered conical section that allows for easier insertion of registration feature 842 into capture element aperture 846 of registration sheet 836. A full complement of probe subassemblies 802 may be assembled to form a probe head with probe tips held in X and Y registration by registration sheet 836.

The manner in which probe subassemblies 802 are aligned so that probe tips 822 are substantially coplanar to the test plane by posts 862, actuators 360, stiffener plates 880, and printed circuit boards 890 can readily be understood in light of the descriptions provide herein.

As those of ordinary skill in the art can readily appreciate from the description herein, an alternative embodiment of probe head 800 exists wherein registration features are affixed to the bottom of stiffener plates 880, which registration features engage capture elements in a registration sheet in the manner described above regarding probe head 100.

Figure 4H:
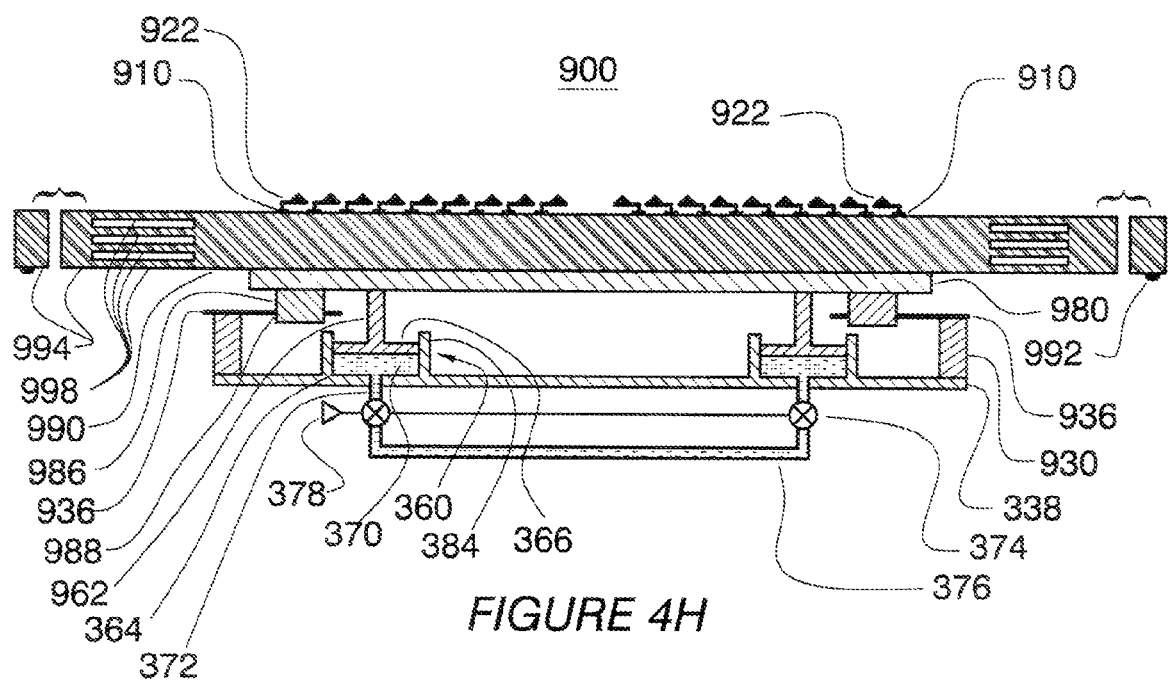

FIG. 4H is a cross-sectional view of probe head 900, the cross-section being taken along a line to provide a view similar to the one shown in FIG. 4F. In accordance with one or more embodiments of the present invention, probe tips 922 on printed circuit board 990 are held in X and Y registration in a test plane and are aligned substantially coplanar to the test plane (i.e., to a portion of the test plane to which they are adjacent) by a registration-alignment apparatus comprised of registration and alignment mechanisms. As shown in FIG. 4H: (a) probe tips 922 are attached to pads 910 disposed on a top surface of printed circuit board 990; (b) printed circuit board 990 is mounted to, for example, by attachment, stiffener plate 980 using any one of a number of methods well known to those of ordinary skill in the art including, for example and without limitation, compliant attachment adhesives available, for example and without limitation, from Able Stick of Rancho Dominguez, Calif.; (c) registration features 986 are attached to a bottom surface of stiffener plate 980; and (d) stiffener plate 980 is supported on three or more posts 962 attached to rigid frame 338 by means of actuators 360.

As shown in FIG. 4H, registration features 986 are engaged in apertures 988 (capture elements 988) of flat springs 936 and flat springs 936 are affixed to registration ring 930 which is attached to frame 338. Thus, an assembly comprised of printed circuit board 990 and stiffener plate 980 is held in position in X and Y registration using two or more flat springs 936 that mechanically link stiffener plate 980 to frame 338. In accordance with one or more embodiments of the present invention, flat springs 936 flex to allow a small vertical motion of stiffener plate 980, printed circuit board 990, and probe tips 922.

As shown in FIG. 4H, portions of printed circuit board 990 are comprised of compliant foliated layers 998. In accordance with one or more embodiments of the present invention, foliated layers 998 are thin layers of laminate material, for example, thin printed wiring layers, which are not joined by adhesive material. As such, compliant foliated layers 998 of printed circuit board 990 provide vertical compliance to allow printed circuit board 990 to move to enable probe tips 922 to be coplanar with a test plane. Printed circuit board areas 994 and associated contacts 992 are held fixed in position by mating contacts and support structure (not shown).

Signals on probe tips 922 are transmitted to and from test equipment (not shown) connected to contact terminals 992 by means of traces and vias in printed wiring board 990 (i.e., through traces in foliated layers 998), and through printed circuit board areas 994 to contact terminals 992.

In operation, probe tips 922 are leveled by sending a signal from controller 378 to fluid valves 374 to actuate each fluid valve to open and permit fluid 370 to flow in channel 376 between hydraulic reservoirs 364. A wafer under test (similar to DUT 124 of FIG. 1B) or other flat surface is urged downwardly against probe tips 922, thereby exerting a force on posts 962 through printed wiring board 990 and stiffener plate 980. Posts 962 move axially until the fluid pressure is equalized in all hydraulic reservoirs 364. After fluid pressure in hydraulic reservoirs 364 is equalized, a signal from controller 378 actuates fluid valves 374 to close, thereby locking posts 962 in place, and maintaining probe tips 922 in position.

In accordance with one or more further embodiments of probe head 900 shown in FIG. 4H, flat springs 936 may be replaced by flat sheet elements comprised of a relatively thicker material and having relatively less flexibility than flat springs 936, and the registration features may be pins protruding through apertures in the flat sheet elements such that the pins are free to move vertically to accommodate leveling of probe tips 922.

As one of ordinary skill in the art can appreciate from the above, a probe apparatus fabricated in accordance with one or more embodiments of the present invention may be used to test chips on an undiced wafer or to test an array of semiconductor devices. In particular, in accordance with one or more embodiments of the present invention, a probe apparatus includes one or more probe substrate tiles, each substrate tile having a plurality of probe tips disposed on a top surface of a dielectric substrate. The probe tips are electrically coupled to substrate terminals on a second surface of the substrate tiles by conductive vias and circuit traces passing through the substrate tiles from a first surface to the second surface. The substrate tiles are held in X and Y position, for example and without limitation, with respect to adjacent ones of the substrate tiles so that the probe tips are held in X and Y registration in a test plane, for example, a plane that substantially coincides with a bottom surface of a test wafer, and the substrate tiles are aligned so that the probe tips are substantially coplanar to the test plane (i.e., to the portion of the test plane to which it is adjacent) by a registration-alignment apparatus comprised of registration and alignment mechanisms.

In accordance with one or more such embodiments, the registration-alignment apparatus includes two or more registration features (mechanically linked to the bottom of each substrate tile) which engage corresponding capture elements on a registration sheet to lock each substrate tile in an X and Y position relative to the registration sheet, and hence, with respect to adjacent ones of the substrate tiles. In further addition, the registration-alignment apparatus includes three or more posts that support each substrate tile. Each post is attached to an actuator that is able to move the post in a direction along an axis of the post, and substantially perpendicular to a test plane. As was described above, allowing movement of the posts, each substrate tile may be aligned so that the probe tips are substantially coplanar with respect to a test plane on a wafer surface, after which, the actuators may be locked so that the posts maintain the substrate tiles so that the probe tips are in substantial coplanar alignment with respect to the test plane. In a specific embodiment, each actuator is a hydraulic reservoir that is locked in place by closing channels linking each hydraulic reservoir to others of the hydraulic reservoirs.

According to one or more further embodiments of the present invention described above, each of a plurality of probe tips on a first surface of a dielectric substrate tile is electrically connected by a via and a circuit trace of the dielectric substrate tile to a corresponding network in a printed circuit. Further, in accordance with one or more such further embodiments, each substrate tile is supported on a rigid mounting block, and three or more posts support each of the mounting blocks; each post is moveably attached to a frame by an actuator. As was described above, allowing movement of the posts along their axes, probe tips on each substrate tile supported by a mounting block may be aligned with respect to a test plane on an associated wafer surface, after which, the actuators are locked so that the posts maintain the substrate tiles so the probe tips are in substantial coplanar alignment with respect to the test plane. In addition, the apparatus includes two or more registration features which engage corresponding capture elements on a registration sheet to lock each mounting block (and hence its associated substrate tile) in an X and Y position relative to the registration sheet, and hence, with respect to adjacent ones of the mounting blocks. Further, as was described above, in accordance with one or more embodiments, the two or more registration features are two or more of the posts supporting a mounting block. Lastly, as was described above, and as will be understood by one skilled in the art, the substrate tiles of these embodiments may be a dielectric substrate, a printed circuit board, a flex cable, and the like, and the actuators may be hydraulic, electrical, piezoelectric, magnetic, and so forth.

As was also described above, one or more embodiments of the present invention provide a method of operating a probe head apparatus for testing or burn-in of an array of semiconductor devices. In accordance with one or more embodiments, the method includes providing two or more substrate tiles each having a plurality of probe tips extending from a first surface, each probe tip being electrically connected to a corresponding network in a printed wiring layer. The method also includes actuators coupling three or more posts supporting the two or more substrate tiles at a determined distance above a common rigid frame. According to specific embodiments, each of the actuators is a hydraulic cylinder wherein fluid in a hydraulic reservoir in each hydraulic cylinder is connected by fluid channels to hydraulic reservoirs in others of the hydraulic cylinders. The method further includes holding each substrate tile in registration with respect to adjacent tiles by two or more registration features that are engaged and held in place by capture elements on a registration sheet. The method additionally includes aligning the plurality of probe tips on each substrate tile to a test plane by urging the probe tips against a wafer surface and then locking the actuators in position after the posts have moved to allow the probe tips to come into coplanar alignment with the test plane on the wafer. The method further includes applying at least one input voltage to a plurality of contact terminals on a flexible electrical cable or a printed wiring board. In selected embodiments according to the present invention, at least one voltage is electrically connected to the plurality of contacts by means of the printed circuit layer. Moreover, the method includes monitoring at least one output voltage on the plurality of contact terminals on the flexible electrical cable.

In accordance with one or more further embodiments of the present invention, a probe head includes one or more printed circuit boards with selected areas comprised of compliant foliated layers. In accordance with one or more such further embodiments, the foliated layers are thin layers of laminate material, for example, thin printed wiring layers, which are not joined by adhesive material. As such, as was described above, the compliant foliated layers of the printed circuit boards provide vertical compliance to allow the printed circuit boards to move. In accordance with one or more such embodiments, the printed circuit boards may be electrically coupled to substrate tiles having probe tips disposed on a top surface thereof, and in accordance with one or more further such embodiments, the printed circuit boards have probe tips disposed on a top surface thereof.

In accordance with one or more still further embodiments of the present invention, registration features comprise capture elements in flat sheet elements (for example, flat springs) affixed to a frame, directly or indirectly.

It should be understood that although the description has described embodiments providing X and Y registration, this merely refers to registration to a coordinate which coordinate may be described in any one of a number of alternative ways, including a coordinate fixed to a rigid frame that is attached, in turn, to a wafer probe station.

Embodiments of the present invention described above are exemplary. As such, many changes and modifications may be made to the description set forth above while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A probe head for contacting microelectronic devices substantially lying in a test plane, the probe head comprising:
   one or more substrate tiles having one or more probe tips disposed on a top surface thereof; and
   a registration-alignment apparatus that holds the one or more substrate tiles: (a) in position so that the one or more probe tips are held in registration in the test plane, and (b) aligned so that the one or more probe tips are substantially coplanar to the test plane, which registration-alignment apparatus comprises:
   one or more capture elements affixed, directly or indirectly, to a frame and the substrate tiles to provide the registration in the test plane;
   three or more posts mechanically supporting at least one of the one or more substrate tiles; and
   alignment actuators affixed, directly or indirectly, to the frame and the posts, which alignment actuators may be actuated to enable the posts to move and align in response to forces applied thereto from the one or more substrate tiles, and may be actuated to prevent the posts from moving;
   wherein:
   the alignment actuators for the three or more posts comprise hydraulic reservoirs connected by fluid channels; and
   the probe head further comprises a valve apparatus that can be opened or closed to fluid flow in the fluid channels from any hydraulic reservoir to any other hydraulic reservoir.

2. A probe head for contacting microelectronic devices substantially lying in a test plane, the probe head comprising:
   one or more substrate tiles having one or more probe tips disposed on a top surface thereof; and
   a registration-alignment apparatus that holds the one or more substrate tiles: (a) in position so that the one or more probe tips are held in registration in the test plane, and (b) aligned so that the one or more probe tips are substantially coplanar to the test plane, which registration-alignment apparatus comprises:
   one or more capture elements affixed, directly or indirectly, to a frame and the substrate tiles to provide the registration in the test plane;
   three or more posts mechanically supporting at least one of the one or more substrate tiles; and
   alignment actuators affixed, directly or indirectly, to the frame and the posts, which alignment actuators may be actuated to enable the posts to move and align in response to forces applied thereto from the one or more substrate tiles, and may be actuated to prevent the posts from moving;
   wherein the registration-alignment apparatus further comprises flat springs affixed to the frame, and the capture elements are apertures in the spring.

3. A probe head for contacting microelectronic devices substantially lying in a test plane, the probe head comprising:
   one or more substrate tiles having one or more probe tips disposed on a top surface thereof; and
   a registration-alignment apparatus that holds the one or more substrate tiles: (a) in position so that the one or more probe tips are held in registration in the test plane, and (b) aligned so that the one or more probe tips are substantially coplanar to the test plane, which registration-alignment apparatus comprises:
   one or more capture elements affixed, directly or indirectly, to a frame and the substrate tiles to provide the registration in the test plane;
   three or more posts mechanically supporting at least one of the one or more substrate tiles; and
   alignment actuators affixed, directly or indirectly, to the frame and the posts, which alignment actuators may be actuated to enable the posts to move and align in response to forces applied thereto from the one or more substrate tiles, and may be actuated to prevent the posts from moving;
   wherein:
   the registration-alignment apparatus further comprises two or more registration features disposed on a bottom surface of the substrate tiles, which registration features engage the capture elements;

the registration-alignment apparatus further comprises a flexible sheet affixed to the frame, and the capture elements are apertures in the sheet; and each of the two or more registration features is slidebly attached to a capture element of the flexible sheet.

4. A probe head for contacting microelectronic devices substantially lying in a test plane, the probe head comprising:

one or more substrate tiles having one or more probe tips disposed on a top surface thereof; and a registration-alignment apparatus that holds the one or more substrate tiles: (a) in position so that the one or more probe tips are held in registration in the test plane, and (b) aligned so that the one or more probe tips are substantially coplanar to the test plane, which registration-alignment apparatus comprises:

a flexible sheet affixed to a frame having a plurality of capture elements arrayed over the flexible sheet to provide the registration in the test plane;

two or more registration features affixed to a bottom surface of each of the substrate tiles; and three or more posts mechanically supporting at least one of the one or more substrate tiles;

wherein each of the two or more registration features is attached to a capture element of the flexible sheet.

* * * * *